United States Patent [19]

Usui

[11] Patent Number: 5,513,638
[45] Date of Patent: May 7, 1996

[54] METHOD OF COLLECTING IMAGE DATA OF MRI AND MAGNETIC RESONANCE IMAGING APPARATUS

[75] Inventor: Yoshiyuki Usui, Kuroiso, Japan

[73] Assignee: Kabushiki Kaisha Toshiba, Kawasaki, Japan

[21] Appl. No.: 264,999

[22] Filed: Jun. 24, 1994

[30] Foreign Application Priority Data

Jun. 24, 1993 [JP] Japan ................................ 5-153517

[51] Int. Cl.$^6$ .................................................. A61B 5/055
[52] U.S. Cl. ...................... 128/653.2; 128/696; 128/708
[58] Field of Search ............................ 128/653.2, 708, 128/696, 653.3; 324/309

[56] References Cited

U.S. PATENT DOCUMENTS

| 4,982,328 | 1/1991 | Kasugai | 324/309 |
|---|---|---|---|
| 5,031,624 | 7/1991 | Mistretta et al. | 128/653.2 |
| 5,168,226 | 12/1992 | Hinks | 324/309 |
| 5,228,532 | 6/1993 | Mori | 128/653.2 |
| 5,329,925 | 7/1994 | Ness Aiver | 128/653.2 |

FOREIGN PATENT DOCUMENTS 5-68673  9/1991  Japan.

Primary Examiner—Krista M. Zele
Attorney, Agent, or Firm—Ronald L. Yin; Limbach & Limbach

[57] ABSTRACT

In an method of collecting image data in magnetic resonance imaging, a sequential order for collecting image data of the plurality of sliced planes including a most clinically important sliced plane is decided by a sequential order decision unit. Synchronizing information related to at least one sliced plane of the plurality of sliced planes is decided by a synchronizing information decision unit. At least two sliced planes includes the most clinically important sliced plane, and are synchronized with at least one different reference pulse for collecting the image data. The image data of the plurality of sliced planes are collected by an image data collection step at every repetition time by selectively exciting each of the plurality of sliced planes on the basis of the synchronizing information and the sequential order.

30 Claims, 11 Drawing Sheets

| | N=7 | 8 | 9 | 10 | 11 | 12 | 13 | 14 |
|---|---|---|---|---|---|---|---|---|
| TWO HEART BEATS | 4+3 | 4+4 | 5+4 | 5+5 | 6+5 | 6+6 | 7+6 | 7+7 |
| THREE HEART BEATS | 3+2+2 | 3+3+2 | 3+3+3 | 4+3+3 | 4+4+3 | 4+4+4 | 5+4+4 | 5+5+4 |
| FOUR HEART BEATS | 2+2+2+1 | 2+2+2+2 | 3+2+2+2 | 3+3+2+2 | 3+3+3+2 | 3+3+3+3 | 4+3+3+3 | 4+4+3+3 |
| ... | ... | ... | ... | ... | ... | ... | ... | ... |

FIG. 5

METHOD OF COLLECTING IMAGE DATA OF MRI AND MAGNETIC RESONANCE IMAGING APPARATUS

BACKGROUND OF THE INVENTION

1. Field of the Invention

The present invention relates to a method of collecting image data of an MRI (magnetic resonance imaging) for collecting image data of a plurality of sliced planes and to a magnetic resonance imaging (MRI) apparatus. More particularly, the present invention relates to a method of collecting image data of an MRI for collecting image data in synchronization with heart beat signals and to a magnetic resonance imaging apparatus.

2. Description of the Prior Art

An MRI employs an image employing a multi-slice technology (hereinafter called a multi-slice imaging) having an arrangement that a plurality of continuous imaged cross sections (hereinafter called sliced planes) are imaged repeatedly at predetermined repetition time (hereinafter called TR) so as to collect image data.

In MRI, it is required to restrict artifacts (a CSF (corebrospinal fluid) flow artifact and a bloodstream artifact and the like) generated due to pulsation of the heart when image data is collected. As a method of restricting artifacts of the foregoing type, there have been used a heart beat synchronizing method (an ECG synchronizing method) for synchronizing the timing of collecting image data with heart beats (or pulse waves) or a PPG (Peripheral Gating) method for synchronizing it with reflected signals from the bloodstream at the finger tip or the like. The foregoing synchronizing methods are characterized in that the timing of collecting image data is synchronized with reference pulses representing heart beats (hereinafter the reference pulses called R waves), the reference pulses being included in a signal, such as the heart beat signal or the reflected signal from the bloodstream at the finger tip or the like, which is in proportion to the movement of the heart (hereinafter the signal called the heart beat signal).

Since the multi-slice imaging performed by using the heart beat synchronizing method or the PPG synchronizing method is mainly employed when image data of, for example, a proton density weighted image data or a T2-weighted image data, is collected, a long TR is required. In the clinical operation, time longer than two heart beats is used as the TR. In this description, an operation of collecting image data by synchronizing with time corresponding to n (n 1) heart beats is called a synchronization with n heart beats.

FIG. 10 shows a specific procedure for collecting image data of a sagittal image of the spine by the multi-slice imaging employing the synchronization with two heart beats.

FIG. 10A shows an example of a sequence for collecting image data when the axis of abscissa stands for time t, in which R11, R12 and R21 represent R waves and R—R represents an interval between R waves. A pulse train shown in FIG. 10 indicates the timing of collecting image data. The synchronizing timing is expressed by arrow symbol ↑. FIG. 10B shows the positions (1 to 7 shown in FIG. 10B are called slicing positions hereinafter) on the sliced planes of a sagittal image of the spine. FIG. 10C shows the relationship between a sequential order (a sequential order of selective excitation of sliced planes) at the timing of collecting image data shown in FIG. 10A and the slicing positions shown in FIG. 10B.

The method of collecting image data employing the synchronization with two heart beats has an arrangement that a sliced plane (a slicing position 1 shown in FIG. 10B; hereinafter called a sliced plane 1) at the smallest slicing position is selectively excited in synchronization with a first R wave (R11) in the period TR to collect image data. Then, other sliced planes are excited at predetermined time intervals (hereinafter called interval I) to collect image data. Furthermore, the foregoing image data collection is repeated every TR (the time corresponding to two heart beats).

At this time, the sliced planes are selectively excited in a sequential order as shown in FIG. 10C, that is, every other sliced plane is sequentially selectively excited.

For example, the sliced plane 1 is selectively excited, and every other sliced plane at large slicing positions (odd number sliced planes) is sequentially selectively excited up to the maximum odd number sliced plane 7. Then, a sliced plane 2 at the minimum even number slicing position is selectively excited, and then every other sliced plane (even number sliced planes) is sequentially selectively excited.

When all sliced planes have been excited, synchronization with the reference pulse R21, after TR that is, [(R—R)1+ (R—R)2 (time corresponding to two heart beats)] has passed from the excitation of the sliced plane 1, is performed to selectively excite the sliced plane 1. Then, similar processes are repeated.

However, the foregoing method of collecting image data of a MRI employing the synchronizing method has the following problems: (1) The effect of restricting artifacts deteriorates due to deviation in the timing of collecting image data.

In order to restrict the artifacts, it is preferable that states of flow of image data to be collected every TR be the same. However, the interval (R—R) of the R wave is not strictly constant, thus resulting in the deviation of the timing of collecting image data at every data collection with respect to the time phase of the heart if a long time passes from the synchronizing timing. The timing of collecting image data at every data collection with respect to the time phase of the heart does substantially deviate immediately after the synchronizing timing.

An example of the deviation of the timing of collecting image data will now be described with reference to FIG. 11 (note that the waveform of the R wave is simply expressed by a pulse waveform). When the last two sliced planes D1 are selectively excited, the timing of collecting image data at the first data collection and the timing of collecting image data at the second data collection deviate from each other because the intervals of the R wave are different from each other ((R—R)2−(R—R)1=Ts). Moreover, a deviation in the timing of collecting image data at the selective excitation of the other sliced planes is present. The deviation in the timing of collecting image data with respect to the time phase of the heart while repeatedly selectively exciting the same sliced plane is one of the causes that deteriorate the effect of restricting artifacts. (2) The incomplete effect of restricting artifacts due to the problem (1) becomes critical for the sliced plane most clinically important, the artifact of which is required to be restricted most strictly.

In general, the artifact of a sliced plane of clinical importance must be restricted most strictly. If an image data of a sagittal image of the spine is collected, the most clinically important sliced plane is the central sliced plane (because a CSF flow artifact will be easily generated due to presence of many CSF flows on the sliced plane including the median line), and the second most important sliced sliced planes are planes adjacent to the central sliced plane. For example, among the sliced planes 1 to 7 of a sagittal image of the spine as shown in FIG. 12A, a central sliced plane 4 is the most clinically important (with mark S1). The secondly clinically important sliced plane is sliced plane 3 and sliced plane 5 (with mark S2) adjacent to the central sliced plane 4. The clinical importance degrades in a direction toward the periphery.

However, the image of a sagittal image of the spine has been usually performed by collecting data in such a way that a plurality of sliced planes are sequentially selectively excited starting from an end thereof.

FIG. 12B shows an example of a sequential order (which is the same as the sequential order shown in FIG. 10C) of the selective excitation employed in the image of a sagittal image of the spine. The foregoing sequential order causes the sliced planes 3 and 5 to be selectively excited immediately after the synchronizing timing to collect image data. However, image data of the sliced plane 4, the most clinically important is collected at the sixth order. Thus, the synchronizing effect deteriorates due to the problem (1). That is, the foregoing sequential order of the selective excitation encounters deterioration in the effect of restricting artifacts of the sliced plane, the artifact of which is intended to be restricted most strictly.

SUMMARY OF THE INVENTION

The present invention is directed to overcome the foregoing problems, and accordingly an object of the present invention is to provide a method of collecting image data of an MRI and a magnetic resonance imaging apparatus capable of improving an effect of restricting artifacts due to deviation in the timing of collecting image data, and improving an effect of restricting artifacts relating to desired sliced planes.

In order to achieve this object, according to one aspect of the present invention, there is provided a method of collecting image data in magnetic resonance imaging, in which a motion signal of an object to be examined is detected and image data of a plurality of continuously arranged imaging regions of the object to be examined are collected on the basis of the detected motion signal, the method comprising the steps of deciding a synchronizing information regarding to at least two imaging regions of the plurality of imaging regions, the at least two imaging regions being synchronized with at least two different motion signals, respectively, and collecting the image data of the plurality of imaging regions on the basis of the synchronizing information.

In the preferred embodiments of this aspect, the imaging regions synchronized with the motion signals are two sliced planes of the object to be examined. The image data of the plurality of imaging regions are collected at every repetition time by selectively exciting each of the plurality of imaging regions, the repetition time corresponding to two periods of the motion signals.

In order to achieve the foregoing object, according to another aspect of the present invention, there is provided a method of collecting image data in magnetic resonance imaging, in which a motion signal of an object to be examined is detected and image data of a plurality of continuously arranged imaging regions of the object to be examined are collected on the basis of detected the motion signal, the method comprising the steps of deciding a sequential order for collecting image data of the plurality of imaging regions, deciding a synchronizing information related to at least two imaging regions of the plurality of imaging regions, the at least two imaging regions being synchronized with at least two different motion signals, respectively, and collecting the image data of the plurality of imaging regions on the basis of the synchronizing information and the sequential order.

In the preferred embodiments of this aspect of the present invention, the synchronizing information decision step includes the steps of dividing the plurality of imaging regions into plural groups of imaging regions, and deciding a first order imaging region in each of the plural groups of imaging regions in accordance with the sequential order for collecting image data, the first order imaging region being synchronized with the motion signal.

This aspect of the present invention has an arrangement that the plural groups of imaging regions are two groups of imaging regions.

This aspect of the present invention has an arrangement that the imaging regions synchronized with the motion signals are two imaging regions.

This aspect of the present invention has an arrangement that the image data of the plurality of imaging regions are collected at every repetition time by selectively exciting each of the plurality of imaging regions, the repetition time corresponding to two periods of the motion signals.

This aspect of the present invention has an arrangement that the sequential order is composed of sequentially selecting imaging regions on every other imaging region.

In order to achieve the foregoing object, according to a further aspect of the present invention, there is provided a magnetic resonance imaging apparatus, in which a motion signal of an object to be examined is detected and image data of a plurality of continuously arranged imaging regions of the object to be examined are collected on the basis of detected the motion signal, the apparatus comprising means for deciding a synchronizing information related to at least two imaging regions of the plurality of imaging regions, the at least two imaging regions being synchronized with at least two different motion signals, respectively, and means for collecting the imaging regions on the basis of the synchronizing information.

In order to achieve the foregoing object, according to a still further aspect of the present invention, there is provided a method of collecting image data in magnetic resonance imaging, in which a motion signal of an object to be examined is detected and image data of a plurality of continuously arranged imaging regions of the object to be examined are collected on the basis of the detected motion signal, the method comprising the steps of deciding a sequential order for collecting image data of the plurality of imaging regions including a most clinically important imaging region, deciding a synchronizing information related to at least one imaging region of the plurality of imaging regions, the at least one imaging region including the most clinically important imaging region and being synchronized with at least one different motion signal, and collecting the image data of the plurality of imaging regions on the basis of the synchronizing information and the sequential order.

This still further aspect of the present invention has an arrangement that the image data of the plurality of imaging regions are collected at every repetition time by selectively exciting each of the plurality of imaging regions, the repetition time corresponding to two periods of the motion signals.

This still further aspect of the present invention has an arrangement that the sequential order decision step is a step of determining the order of a most clinical important imaging region and imaging regions having high priority order, and said image data collection step is a step of collecting image data of the most clinically important imaging region and collecting image data of the imaging region having high priority order in accordance with the sequential order.

This still further aspect of the present invention has an arrangement that the plurality of imaging regions of the object to be examined are a plurality of sagittal planes of a spine, and the most clinically important imaging region is the sagittal plane including the median line of the object to be examined.

This still further aspect of the present invention has an arrangement that the sequential order is composed of collecting a first image data of the sagittal plane including the median line, the sagittal plane including the median line being the reference plane, collecting a second image data of the sagittal planes toward a direction going away from the reference plane in parallel with a sliced direction alternately, the sagittal planes being arranged by the one side of a sliced plane adjacent to the reference plane and another side of a sliced plane adjacent to the reference plane.

This still further aspect of the present invention has an arrangement that the sequential order is composed of collecting a first image data of the sagittal plane including the median line, the sagittal plane including the median line being the reference plane, collecting a second image data of the sagittal planes toward a direction going away from the reference plane in parallel with a slicing direction secondly, the sagittal planes being arranged by the one side of the sliced plane adjacent to the reference plane, and collecting a third image data of the sagittal planes toward a direction going away from the reference plane in parallel with a slicing direction, the sagittal planes being arranged by another side of the sliced plane adjacent to the reference plane.

In order to achieve the foregoing object, according to a still further aspect of the present invention, there is provided a magnetic resonance imaging apparatus, in which a motion signal of an object to be examined is detected and image data of a plurality of continuously arranged imaging regions of the object to be examined are collected on the basis of the detected heart beat signal, the apparatus comprising means for deciding a sequential order for collecting image data of the plurality of imaging regions including a most clinically important imaging region, means for deciding a synchronizing information related to at least one imaging region of the plurality of imaging regions, the at least one imaging region including the most clinically important imaging region and being synchronized with at least one different motion signal, and means for collecting the image data of the plurality of imaging regions on the basis of the synchronizing information and the sequential order.

BRIEF DESCRIPTION OF THE DRAWINGS

The accompanying drawings which are incorporated in and constitute a part of this specification, illustrate embodiments of the present invention and, together with the description, serve to explain the principles of the present invention. In the accompanying drawings:

FIG. 5 is a diagram showing an example of dividing a sliced plane;

DESCRIPTION OF THE PREFERRED EMBODIMENTS

Preferred embodiments of the present invention will now be described with reference to the drawings, in each of which a sagittal image of a spine is multi-slice imaged for example.

The waveforms of R waves, which are reference pulses representing heart beats, are simply expressed in the form of pulse waves.

First Embodiment

Figure 1:
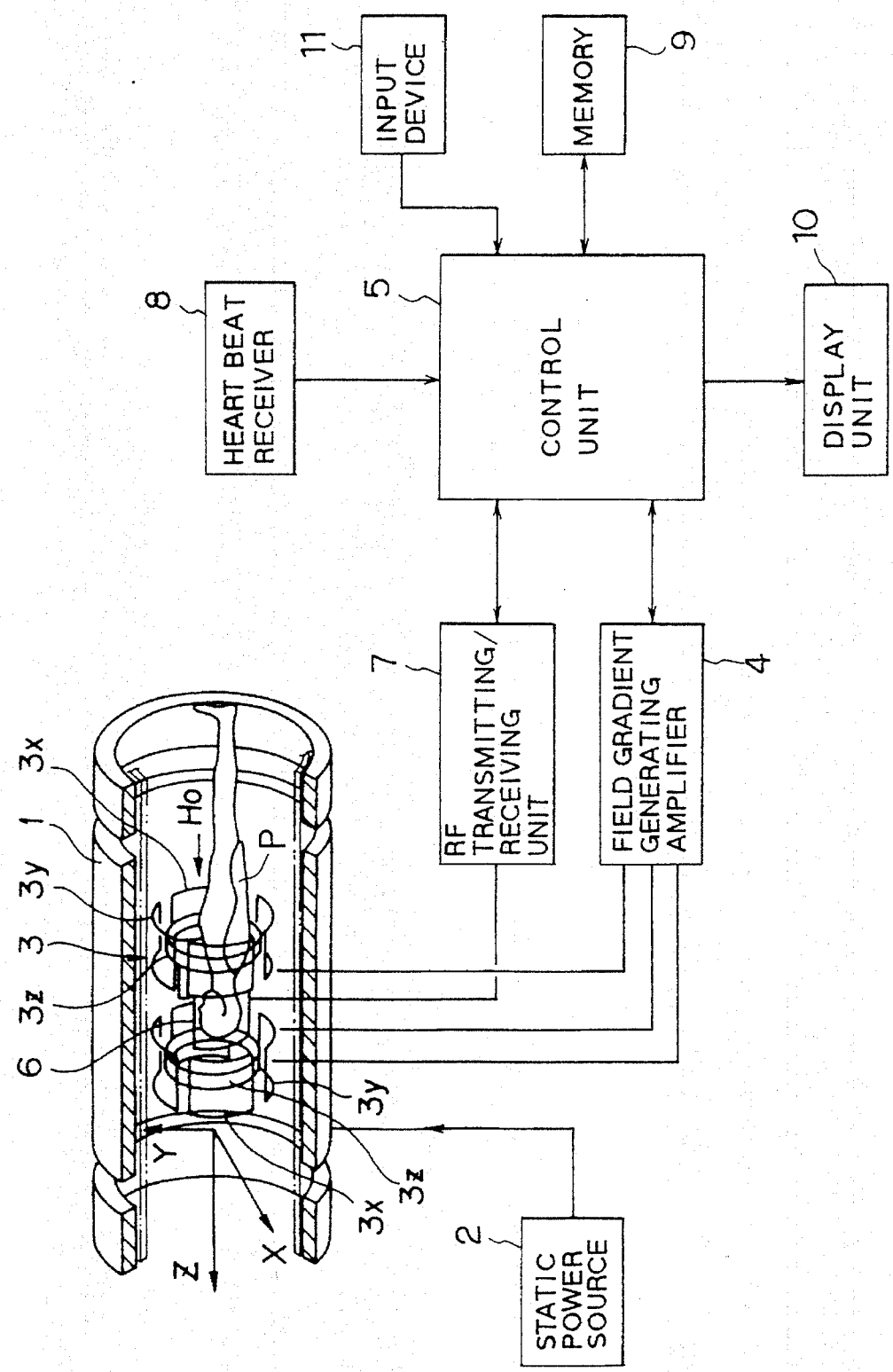
FIG. 1 is a schematic structural view of a magnetic resonance imaging apparatus according to the present invention.

FIG. 1 is an overall block diagram of a magnetic resonance imaging apparatus according to this embodiment.

The magnetic resonance imaging apparatus shown in FIG. 1 comprises a magnet 1 generally formed into a cylinder shape having a hollow portion therein for placing a patient P, and a static power source 2 for supplying required electric current to the magnet 1. When the magnet 1 begins to work, a static field, having a uniform magnetic strength H0 and being directed in the Z-direction along the body axis of the patient P, is formed in the central diagnostic space in the hollow portion of the magnet 1.

In the hollow portion of the magnet 1, there is provided a gradient coil portion 3. The gradient coil portion 3 includes two pairs of x-coils $3x \ldots 3x$ for generating a field gradient in the X-direction, two pairs of y-coils $3y \ldots 3y$ for generating a field gradient in the Y-direction, and one pair of z-coils $3z \ldots 3z$ for generating a field gradient in the Z-direction. The gradient coils $3x$, $3y$, and $3z$ are connected to a control unit 5 through an inclined magnetic field generating amplifier 4.

The magnetic resonance imaging apparatus comprises an RF coil 6 disposed to face the specimen P introduced in the inner space of the magnet 1 and an RF transmitting/receiving unit 7 connected to the RF coil 6. The RF transmitting/receiving unit 7 is connected to the control unit 5.

The magnetic resonance imaging apparatus has a heart beat receiver 8 for detecting heart beat signals of the patient P, said heart beat signals being R waves. The heart beat signals correspond to the motion signals in the present invention. The heart beat receiver 8 is connected to the control unit 5 so as to transmit detected R waves to the control unit 5.

The magnetic resonance imaging apparatus further comprises the control unit 5. The control unit 5 has a computer for totally controlling the apparatus and performing processes shown in FIG. 3 to be described later. A memory 9, a display unit 10 and an input device 11 are connected to the control unit 5. The memory 9 stores programs of pulse sequences such as Fast SE (Spin Echo) method or the like. The input device 11 is provided for inputting necessary information from an operator. The information is sent to the memory 9 through the input device 11 and control unit 5. The information is stored in the memory 9.

The control unit 5, in accordance with the programs and the data or the like stored in the memory 9, controls the field gradient generating amplifier 4 and RF transmitting/receiving unit 7 to control the field gradient and the RF pulses.

In accordance with the control of field gradient generating amplifier 4 and RF transmitting/receiving unit 7, the RF coil 6 receives a high frequency electric pulse supplied from the RF transmitting/receiving unit 7 to generate and transmit high frequency magnetic pulses (RF pulses) to a specified sliced plane of the patient, the specified sliced plane being excited from the field gradient which is applied to the gradient coils. The sliced plane of the patient corresponds to the imaging region in the present invention. The RF coil 6 receives and amplifies a NMR (nuclear magnetic resonance) signal transmitted from the sliced plane of the patient P.

The control unit 5 is arranged to subject the NMR signals obtained from the sliced plane through the RF coil 6 and the RF transmitting/receiving unit 7 to a computing process including a two dimensional Fourier transformation so as to generate image signals. Thus-generated image signals is displayed on the display unit 10.

Moreover, the control unit 5 controls the field gradient generating amplifier 4 and RF transmitting/receiving unit 7 to control the field gradient and the RF pulses in accordance with the supplied R waves so as to repeatedly collect image data of a plurality of sliced planes of the patient P at predetermined repetition time intervals (TR). Furthermore, the control unit 5 synchronizes the timing of collecting image data with a plurality of R waves among the R waves generated within the TR.

The timing of collecting image data of the sliced planes and the sequential order of selective excitation employed in this embodiment will now be described with reference to FIG. 2.

Figure 12A:
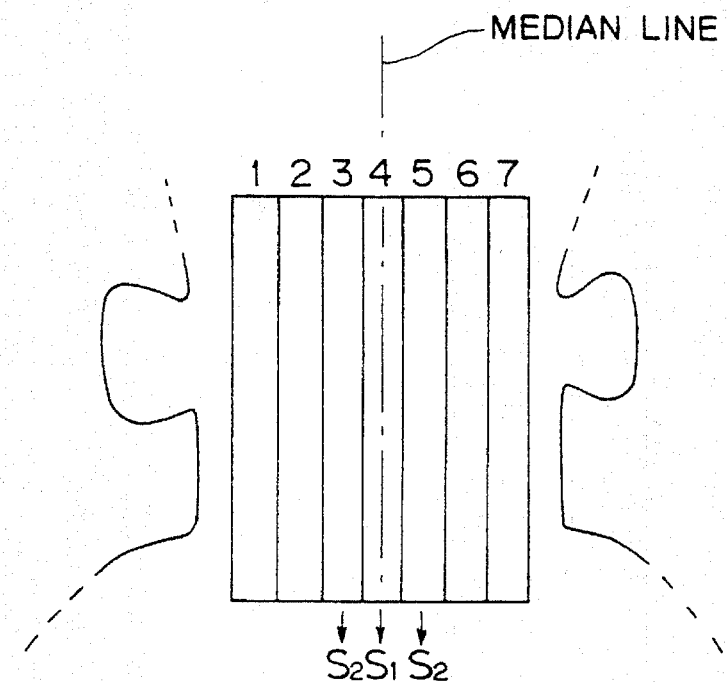
FIG. 12A is a diagram illustrating a central sliced plane (a sliced plane including a median line) according to the conventional example.
Figure 12B:
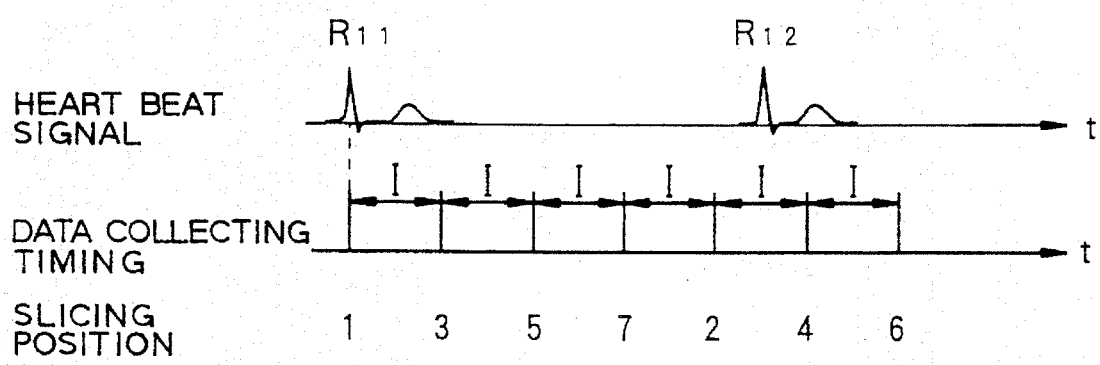
FIG. 12B is a chart illustrating a sequence of selective excitation of sliced planes according to the conventional example.

In this embodiment, the number of the sliced planes of the sagittal image of the spine is seven and the slicing positions are made to be the same as those of the conventional example shown in FIG. 12A.

Figure 2:
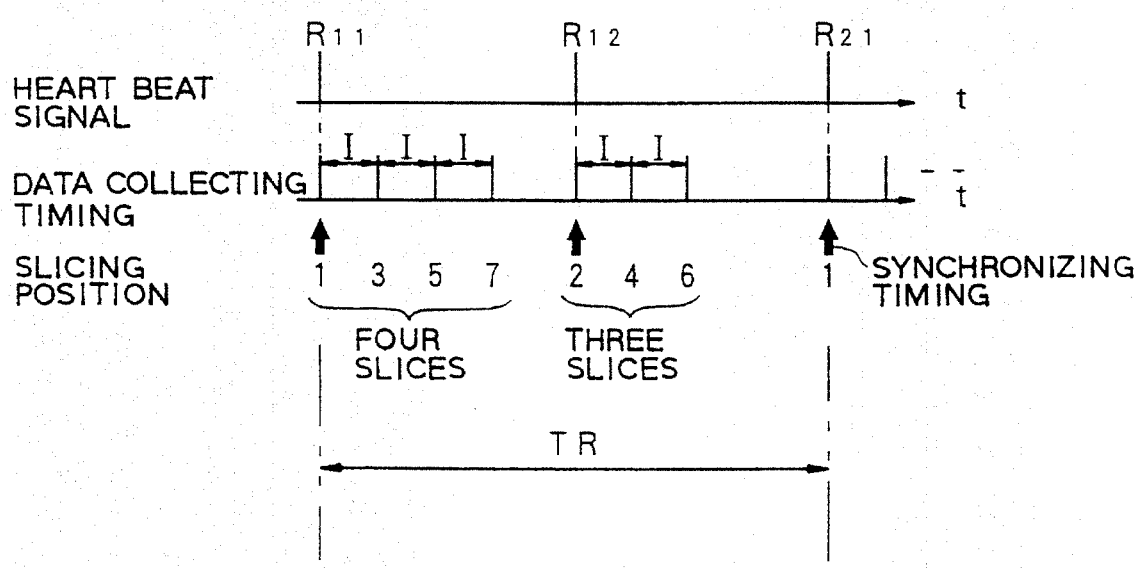
FIG. 2 is a chart for illustrating a sequence for collecting image data by means of synchronization with two heart beats according to a first embodiment.

FIG. 2 is a chart showing the timing of collecting image data of seven sliced planes in a manner of synchronization with two R waves and the sequential order of the selective excitation.

It should be noted that the synchronizing information related to the slicing positions of the two sliced planes which is synchronized with two R waves, and the number of the sliced planes to be selectively excited continuously from the synchronization, is previously inputted to the input device 13 and are previously stored in the memory 9. It should also be noted that the procedure required to determine the sequential order of the selective excitation of the slicing position is previously inputted to the input device 11 and are previously stored in the memory 9.

As shown in FIG. 2, the control performed by the control unit 5 causes synchronization to be performed two times at each period of the R wave among the TR to selectively excite a predetermined sliced plane. The sliced planes omitted from the synchronization are selectively excited at predetermined intervals (I).

As for the sequential order of the selective excitation of the slicing positions, a method is employed which has an arrangement that every other sliced plane is sequentially selected (slicing positions 1, 3, 5, 7, 2, 4 and 6 shown in FIG. 2).

At this time, the plurality of sliced planes are divided into two groups of sliced planes. A first group of the sliced planes (slicing positions 1, 3, 5, 7) is four sliced planes and a second group of the sliced planes (slicing positions 2, 4, 6) is three sliced planes.

Further, the first order sliced plane (slicing position 1) in the first group in accordance with the sequential order is synchronized with the first R wave among the TR to be selectively excited. The three sliced planes (sliced position 3, 5, 7) in the first group are selectively excited continuously from the first synchronization. The second order sliced plane (sliced position 2) in the second group in accordance with the sequential order is synchronized with the second R wave among the TR to selectively excited. The two sliced planes (sliced position 4, 6) in the second group are selectively excited continuously from the second synchronization.

Figure 3:
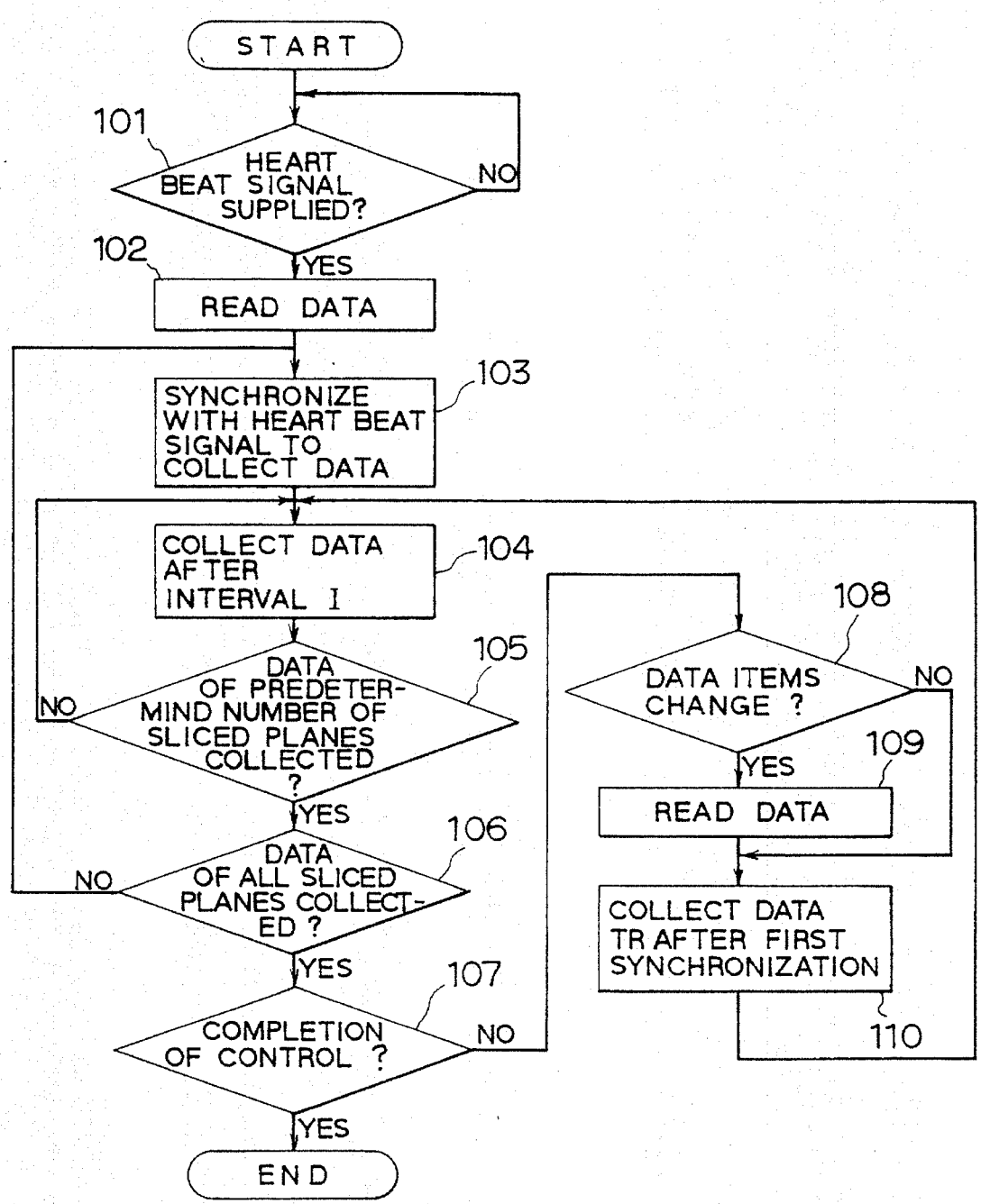
FIG. 3 is a schematic flow chart showing an example of a process performed by a control unit according to the present invention.
Figure 4:
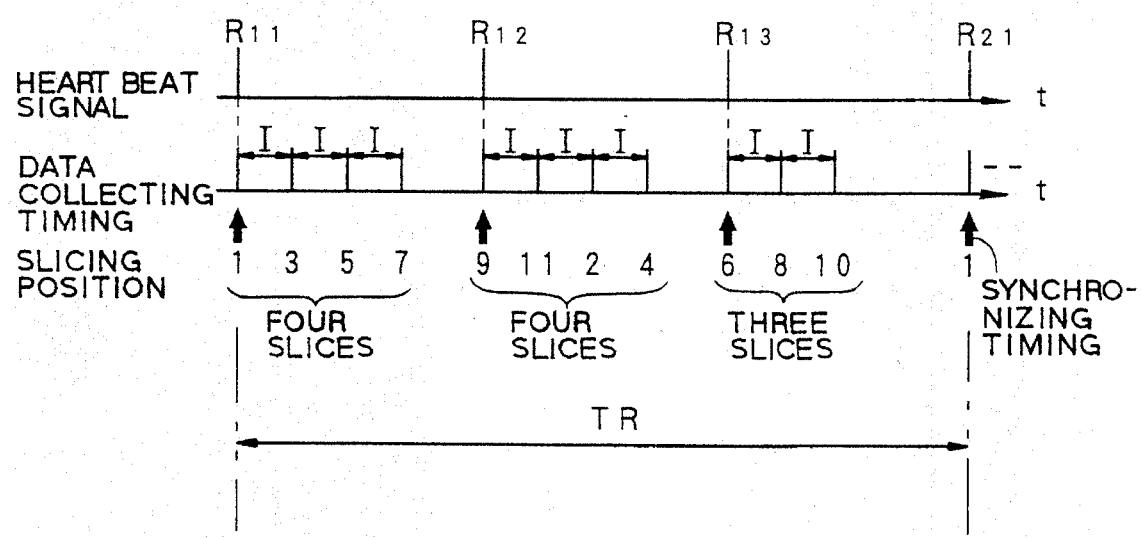
FIG. 4 is a chart illustrating timing of collecting image data by means of synchronization with three heart beats and a sequential order of selective excitation.

The operation of this embodiment will now be described. FIG. 3 is a flow chart showing a process for collecting data.

When a multi-slice imaging operation is commanded, the control unit 5, in step 101, determines whether or not R waves have been supplied from the heart beat receiver 8. If a negative discrimination has been made, no image is imaged until the R waves are supplied. If an affirmative discrimination has been made in step 101, the control unit 5 reads, in step 102, the data items previous stored in the memory 9, the data items being the programs of the pulse sequence, the synchronizing information and the sequential order of the selective excitation of the sliced planes.

In step 103, the control unit 5 synchronizes with an R wave (R11) supplied initially (corresponding to a first heart beat) to control the field gradient generating amplifier 4 and RF transmitting/receiving unit 7 for selectively exciting the sliced plane 1 so as to collect image data. Then, the flow proceeds to step 104 in which the control unit 5 collects image data by controlling the field gradient generating amplifier 4 and the RF transmitting/receiving unit 7 for selectively exciting the sliced plane 3 by skipping one sliced plane after the interval I in accordance with the predetermined sequential order of the selective excitation (the method of sequentially selecting every other sliced plane). Skipping of the sliced plane is accomplished by a change in the exciting frequency of the field gradient and the RF pulse, the change in the exciting frequency corresponding to the shift of the slicing position occurring due to skipping. In step 105, the control unit 5 discriminates whether or not image data of a predetermined number of slices (four slices) has been collected from the first synchronization. Since image data has been collected from the sliced plane 3 in this state, the control unit 5 makes a negative discrimination and the flow returns to step 104 in which the control unit 5 repeats the foregoing process.

When collection of image data of the sliced plane 7 (the fourth sliced plane) has been completed, the sequential order of the sliced plane 2 causes an affirmative discrimination to be made in step 105. Thus, the flow proceeds to step 106. In step 106, the control unit 5 discriminates whether or not collection of image data from all sliced planes has been completed. Since the sliced planes 2, 4 and 6 are left from the data collection in this case, the control unit 5 makes a negative discrimination. The control unit 5 interrupts collecting image data. The control unit 5 synchronizes with the supplied R wave (R12) to control the field gradient generating amplifier 4 and RF transmitting/receiving unit 7 for selectively exciting the sliced plane 2 so as to collect image data in step 103.

The control unit 5 repeats the processes in steps 104 and 105 until it collects data of a predetermined number of slices (three slices).

When image data collection from the sliced plane 6 (the third sliced plane) has been completed, an affirmative discrimination is made in step 105, followed by proceeding to step 106. Since image data collection from the seven sliced planes has been completed (one cycle of image data collection), an affirmative discrimination is made in step 106.

Thus, the control unit 5 discriminates whether or not it completes the control of the data collection process. Since the multi-slice imaging is performed in this embodiment, image data collection is performed by repeating the process a predetermined number of times. Therefore, a negative discrimination is made in step 107, and the flow proceeds to step 108. In step 108, the control unit 5 discriminates whether or not the data items read from the memory 9 is changed (for example, the operator inputs changed data, the changed data being changed intensity of the field gradient) If it is changed, an affirmative discrimination is made in step 108 so that the changed data is read in step 109 and the flow proceeds to step 110. If no data change takes place, a negative discrimination is made in step 108 and the flow directly proceeds to step 110.

In step 110, the control unit 5 synchronizes with the R wave (R21) after TR has passed from the synchronization with the first R wave (R11) and controls the field gradient generating amplifier and RF transmitting/receiving unit 7 for selectively exciting the sliced plane 1 so as to collect image data. Then, the foregoing processes are sequentially repeated. When image data has been finally collected due to repetition performed a predetermined number of times, an affirmative discrimination is made in step 107 and thus the control is completed here.

The obtained image data is subjected to a predetermined Fourier transformation and digital analog conversion to be converted into image information. The image information is then displayed on the display unit 10 if necessary.

In the multi-slice imaging employing the method of synchronization with two heart beats, the synchronization with the first R wave (R11) causes four sliced planes of the seven sliced planes to be selectively excited. The synchronization with the R wave (R12) at the second heart beat causes the three residual sliced planes to be selectively excited.

Therefore, even if image data (for example, image data of the sliced plane 4) is collected due to the selective excitation after a long time has passed from the synchronization with the first R wave (R11), the image data can be obtained after a relatively shorter time has passed from the synchronization with the R wave (R12) at the second heart beat as compared with the conventional technology. As a result, deviation in the timing of collecting image data can be decreased and thus the artifact can effectively be prevented. Furthermore, the sliced plane 4, which is a sliced plane including the median line, is selectively excited after the interval I has passed from the synchronization with the second R wave (R12) so that image data of the sliced plane 4 is collected. Therefore, deviation from the time phase of the heart can be decreased as compared with the conventional technology and therefore the artifact can effectively be prevented.

An example of collecting image data of eleven sliced planes by means of synchronization with three heart beats is shown in FIG. 3. This example has an arrangement that the plurality of sliced planes are divided into three groups of sliced planes. A first group is four sliced planes (slicing positions 1, 3, 5, 7) which are selectively excited at the first synchronization. A second group is four sliced planes (slicing positions 9, 11, 2, 4) which are selectively excited at the second synchronization. And a third group is three sliced planes (slicing positions 6, 8, 10) which are selectively excited at the third synchronization. The sequential order of collecting image data is such that every other sliced plane above is sequentially selected.

That is, the first synchronization with the first R wave (R11) is performed to selectively excite the sliced plane 1 so as to collect image data. Then, image data of the every other sliced planes 3 and 5 is collected at every interval I. When image data of the predetermined fourth sliced plane (the sliced plane 7) has been collected, the second synchronization with the R wave (R12) at the second heart beat is performed so as to selectively excite the sliced plane 9 to collect image data. Then, image data of the sliced plane 11 and the sliced plane 2 positioned at the even number slicing position is collected at every interval I. When image data has been collected from the predetermined fourth sliced plane (the sliced plane 4), the third synchronization with the R wave (R13) at the third heart beat is performed so as to collect image data from the sliced plane 6. Then, image data is collected from the sliced planes 8 and 10 at every interval I, and thus the images at a collection cycle is completed. Then, the image data collection cycle is repeated every TR.

When synchronization with the R wave is performed a plurality of times, the number of the sliced planes to be selectively excited after performing the synchronization with the R wave, that is, the predetermined assignment of the sliced plane (the division of the sliced plane), is inputted to the input device 10 and stored in the memory 9.

FIG. 5 illustrates examples of division of the groups of the sliced planes. In FIG. 5, numerals s+ u+v+, . . . , represent meanings such that s represents the number of sliced planes in the first group to be selectively excited after the synchronization with the first R wave has been performed, u represents the number of sliced planes in the second group to be selectively excited after the synchronization with the R wave of the second heart beat, v represents the number of sliced planes in the third group to be selectively excited after the synchronization with the R wave of the third heart beat, and so forth.

As described above, the conventional multi-slice imaging employing the synchronization method using the heart beat signals has the arrangement that sequential selective excitation at every interval I is performed after image data has been collected by selectively exciting the sliced plane by synchronizing the first R wave even in a case where image data is collected from many sliced planes or a case where a multiple heart beat synchronization exceeding two heart beats is performed. Therefore, considerable deviation in the timing of collecting image data from the time phase of the heart occurs after a long time has passed from performing the synchronization. As a result, the effect of preventing the artifact has deteriorated excessively.

However, the present invention is able to shorten the time, at which image data is collected from each sliced plane, and which has passed from the synchronization as compared with the conventional technology, even in a case of a multiple heart beat synchronization exceeding two heart beats. As a result, deviation in the timing of collecting image data can be decreased and accordingly the effect of preventing the artifact can be improved.

Moreover, in this embodiment, the sequential order of the selective excitation of the sliced planes is composed of sequentially selecting every other sliced plane. However, this invention is not limited. The sequential order of the selective excitation of the sliced planes may be made such that the order is sequentially selected at intervals of many sliced planes.

Second Embodiment

A second embodiment of the present invention will now be described. A magnetic resonance imaging apparatus according to this embodiment has a similar structure to that shown in the block diagram illustrated in FIG. 1. Therefor its description is omitted or simplified.

A control unit 5 according to this embodiment performs a process similar to that shown in FIG. 3 in such a way that image data of a plurality of sliced planes is collected in synchronization with R waves, the control unit 5 repeating the collection of image data at predetermined repetition times (TR). Moreover, the control unit 5 determines the sequential order of the selective excitation shown in FIG. 6 to be described later. Note that the synchronizing information related to the slicing positions of the two sliced planes which is synchronized with two R waves and the number of the sliced planes to be selectively excited continuously from the synchronization is previously inputted to the input device 13 and are previously stored in the memory 9. It should also be noted that the procedure required to determine the sequential order of the selective excitation of the slicing position is previously inputted to the input device 11 and is previously stored in the memory 9.

The operation of this embodiment will now be described in such a way that the sequential order of selectively exciting the sliced planes is mainly described. In this description, the number of the sliced planes of the sagittal image of the spine (hereinafter the sliced plane called sagittal planes) is seven and the slicing positions are made to be similar to those shown in FIG. 12A which illustrates the conventional example.

Figure 6A:
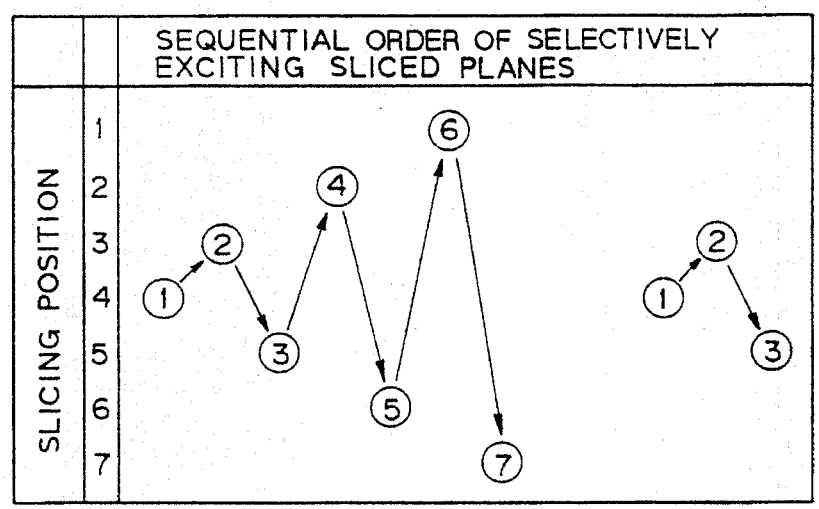
FIG. 6A is a transition diagram of a sequential order of a selective excitation according to a second embodiment.
Figure 6B:
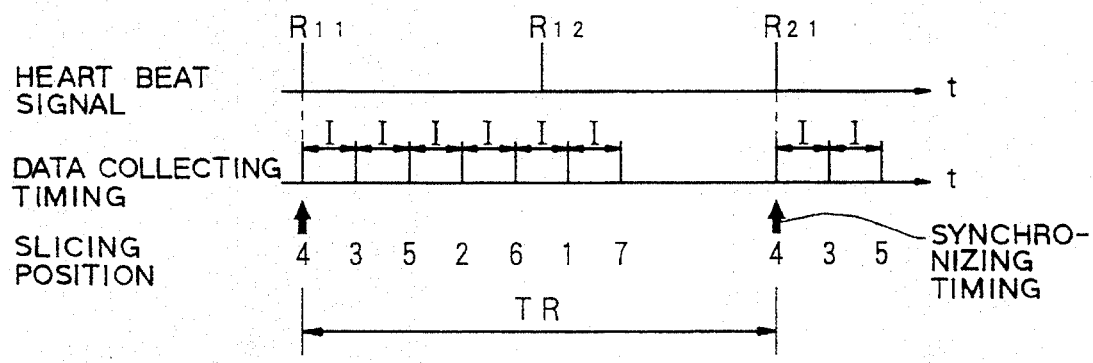
FIG. 6B is a chart illustrating a sequence for collecting image data by means of synchronization with two heart beats according to a second embodiment.

FIG. 6 is a transition diagram of the sequential order of the selective excitation and shows an example of a sequence of collecting image data, in which image data of seven sagittal planes is collected by means of synchronization with two R waves.

In this embodiment, the sequential order of the selective excitation of the sagittal planes is determined in such a way that a sagittal plane of clinical importance, that is, the sagittal plane 4 including the median line, which is the central sagittal plane shown in FIG. 12A, is first selectively excited. Then, the selective excitation is alternately performed in a direction toward the large slicing position and toward the small slicing position.

The timing of collecting image data of the sagittal planes is performed by a method having an arrangement that only the first selective excitation of the sagittal plane is synchronized with the R wave and the selective excitation of the residual sagittal planes is performed at every intervals I. That is, referring to FIG. 5, the synchronization with the R wave (R11) is first performed to selectively excite the sagittal plane 4 to collect image data. Then, the sagittal planes 3, 5, 2, 6, 1 and 7 are sequentially selectively excited at every intervals I to collect image data. Then, the image data collection cycle is completed. The residual operation of the second embodiment are substantially the same as those of the first embodiment. In this embodiment, the synchronization with the sagittal plane 4, which is a sagittal plane, the artifact of which is intended to be most prevented is performed so as to be selectively excited so that image data is collected. Then, the sagittal planes 3 and 5 adjacent to the sagittal plane 4, the artifacts of which are intended to be prevented to a degree next to the sagittal plane 4, are synchronized. Then, the selective excitation is performed after a short time has passed from the synchronization with the sagittal plane 4 so that image data is collected. That is, a plurality of sagittal planes are selectively excited in such a way that the selective excitation is sequentially performed from the clinically important sagittal plane to correspond to the time passed from the R wave. Therefore, deviation in the timing of collecting image data of the sagittal plane of clinical importance can be decreased. As a result, the effect of preventing the artifact of a sagittal plane of clinical importance can be improved.

Third Embodiment

A third embodiment of the present invention will now be described. The magnetic resonance imaging apparatus according to this embodiment has a similar structure to that shown in the block diagram illustrated in FIG. 1. Therefore, description of it is omitted or simplified.

The control unit 5 according to this embodiment performs processes similar to those shown in FIG. 3 in such a way that image data of a plurality of sliced planes is collected in synchronization with a plurality of R waves, the control unit 5 repeating the collection of image data at predetermined repetition times (TR). Moreover, the control unit 5 determines the sequential order of the selective excitation shown in FIG. 7 to be described later, the sequential order of the collection of data of a plurality of sliced plane in accordance with the time passed from the synchronizing timing. It should be noted that the synchronizing information related to the slicing positions of the two sliced planes which is synchronized with two R waves, and the number of the sliced planes to be selectively excited continuously from the synchronization, is previously inputted to the input device 11 and are previously stored in the memory 9. It should also be noted that the procedure required to determine the sequential order of the selective excitation of the slicing position is previously inputted to the input device 11 and is previously stored in the memory 9.

The operation of this embodiment will now be described in such a way that the sequential order of the selective excitation of the sliced planes is mainly described. The number of the sliced planes of the sagittal image of the spine (hereinafter the sliced plane called sagittal planes) is seven and the slicing positions are the same as those shown in FIG. 12A showing the conventional example.

Figure 7:
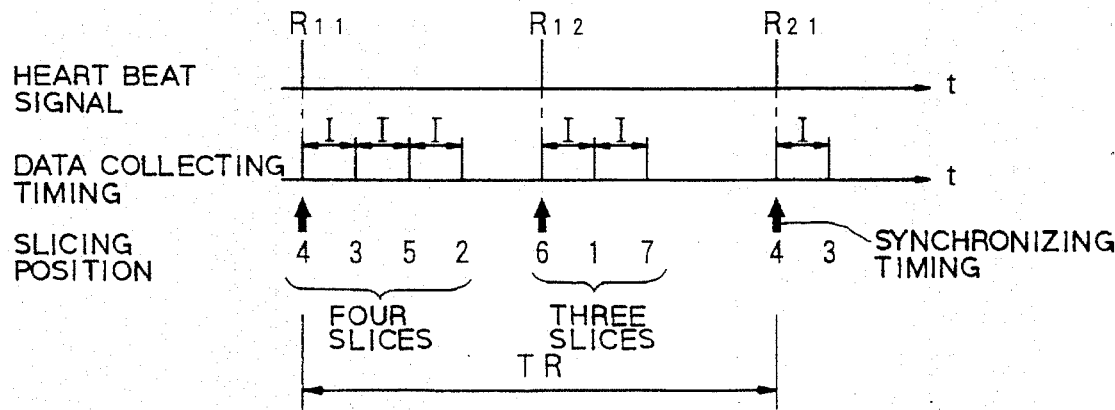
FIG. 7 is a chart illustrating a sequence for collecting data by means of synchronization with two heart beats according to a third embodiment.

FIG. 7 shows an example of a sequence for collecting image data in which image data of seven sagittal planes is collected in the synchronization with two R waves. In this embodiment, the sagittal planes are sequentially selectively excited in the sequential order (the sequential order of the sagittal planes 4, 3, 5, 2, 6, 1 and 7) described in the second embodiment so as to collect image data. Furthermore, the arrangement is made such that synchronization is performed two times at every period of the R wave in the period TR so as to perform the selective excitation for collecting image data. The residual operations of the third embodiment are the same as those of the first embodiment.

According to this embodiment, image data (of, for example, the sagittal plane 7) collected by the selective excitation performed after a long time has passed from the synchronization with the first R wave (R11) is image data collected after a shorter time from the synchronization with the R wave (R12) at the second heart beat as compared with the conventional example. Therefore, deviation in the timing of collecting image data can be decreased and the artifact can effectively be prevented. Furthermore, the sagittal plane 4 which is a sagittal plane including the median line is synchronized to selectively excite for the purpose of collecting image data. Then, the sagittal planes 3 and 5 adjacent to the sagittal plane 4, which are the sagittal plane, the artifacts of which are intended to be restricted next to the sagittal plane 4, are selectively excited after a short time has passed from the synchronization with the R wave (R11) for the purpose of collecting image data. Therefore, the effect of restricting the artifact of the sagittal plane of clinical importance can be improved. It should be noted that special attention must be paid at the diagnosis to an unnatural fact that the artifact preventive effect of the sagittal plane 6 is improved as compared with the sagittal plane 5.

Fourth Embodiment

A fourth embodiment of the present invention will now be described. The magnetic resonance imaging apparatus according to this embodiment has a structure similar to that shown in the block diagram illustrated in FIG. 1. Therefore, the description of it is omitted or simplified.

The control unit 5 according to this embodiment performs processes similar to those shown in FIG. 3 in such a way that image data of a plurality of sliced planes is collected in synchronization with R waves, the control unit 5 repeating the collection of image data at predetermined repetition time (TR) Moreover, the control unit 5 determines the sequential order of the selective excitation shown in FIG. 8 to be described later. It should be noted that the synchronizing information related to the slicing positions of the two sliced planes which is synchronized with two R waves, and the number of the sliced planes to be selectively excited continuously from the synchronization is previously inputted to the input device 13 and are previously stored in the memory 9. It should also be noted that the procedure required to determine the sequential order of the selective excitation of the slicing position is previously inputted to the input device 13 and is previously stored in the memory 9.

The operation of this embodiment will now be described in such a way that the sequential order of the selective excitation of the sliced planes is mainly described. The number of the sliced planes of the sagittal image of the spine (hereinafter the sliced plane called sagittal planes) is seven and the slicing positions are the same as those shown in FIG. 12A showing the conventional example.

Figure 8A:
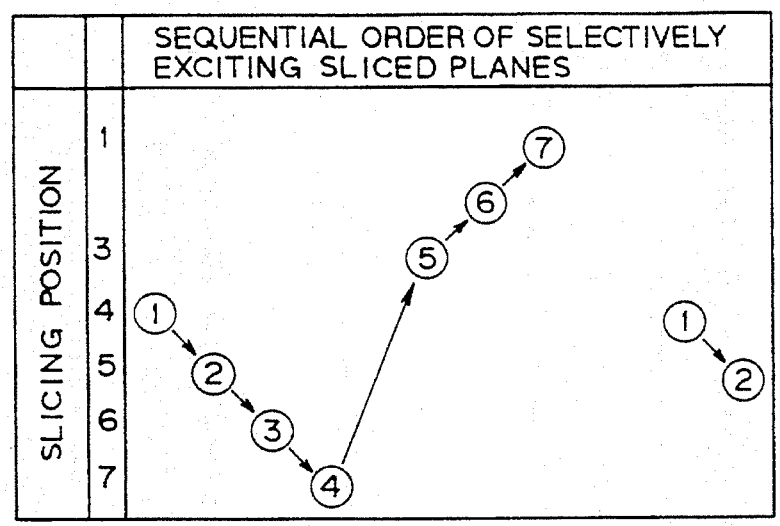
FIG. 8A is a transition diagram of a sequential order of a selective excitation according to a fourth embodiment.
Figure 8B:
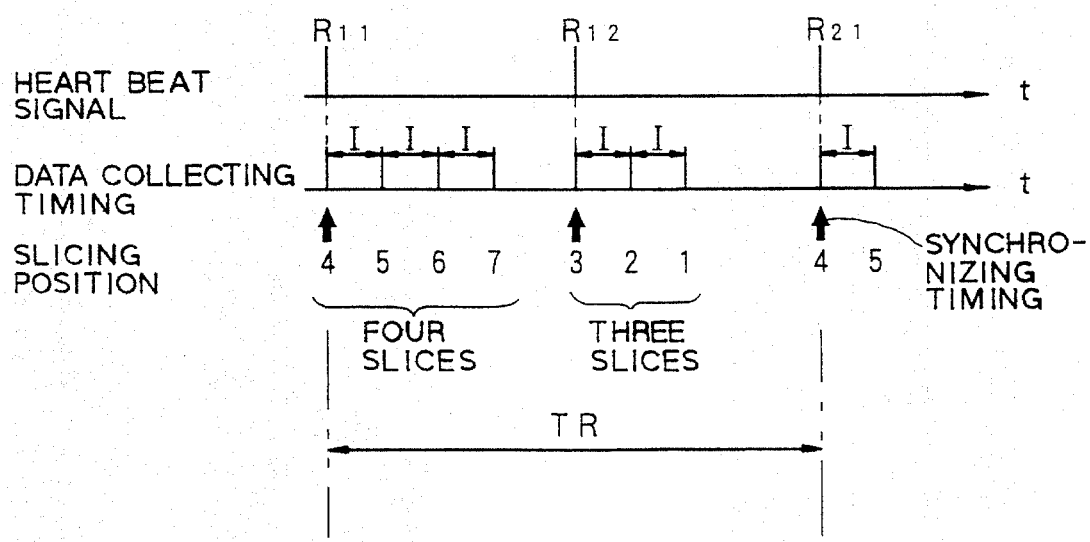
FIG. 8B is a chart illustrating a sequence for collecting image data by means of synchronization with two heart beats according to the fourth embodiment.

FIG. 8 is a transition diagram of the sequential order of the selective excitation and shows an example of a sequence of collecting image data, in which image data of seven sagittal planes is collected by means of synchronization with two heart beats. The sequential order of the selective excitation of the sagittal planes is determined in such a way that the sagittal plane of critical importance, that is, the sagittal plane 4 which is the central sliced plane shown in FIG. 12A and which includes the median line, is first selectively excited to collect image data. Then, the selective excitation of the residual sagittal planes is sequentially performed in a direction from the center toward the large slicing position at intervals I to collect image data. After data from all sagittal planes in the direction of the large slicing position has been collected, selective excitation is, at intervals I, sequentially performed from the sagittal plane adjacent to the central sagittal plane at a smaller slicing position toward the smaller slicing position so that image data is collected. The collection of image data of the sagittal planes is performed two times during TR similarly to the first embodiment at the synchronization timing at each frequency of the R wave.

That is, referring to FIG. 8, synchronization with the first R wave (R11) is performed to selectively excite the sagittal plane 4. Then, the sagittal planes 5, 6 and 7 are sequentially selectively excited at every intervals I to collect image data in the direction in which the slicing position is enlarged. When the collection of data from the sagittal plane 7 has been completed, synchronization with the second R wave (R12) is performed to selectively excite the sagittal plane 3. Then, the sagittal planes 2 and 1 are selectively excited at every interval I to collect image data in the direction in which the slicing position is reduced. Then, the foregoing process is repeated every TR so as to collect image data.

According to this embodiment, the clinically important sagittal plane 4 including the median line is selectively excited by performing synchronization with the R wave so as to collect image data. Then, the selective excitation is sequentially performed from the sagittal plane 4 toward the outside (toward the sliced plane 1 or the sliced plane 7) at every I to collect image data. Therefore, a natural operation can be realized such that the effect of restricting the artifact is gradually lowered as the slicing position is enlarged or reduced from the clinically important sagittal plane (that is, the clinical importance is lowered). Therefore, the effect of restricting the artifact of the sagittal plane of clinical importance can be improved without necessity of paying attention at the diagnosis.

Figure 9A:
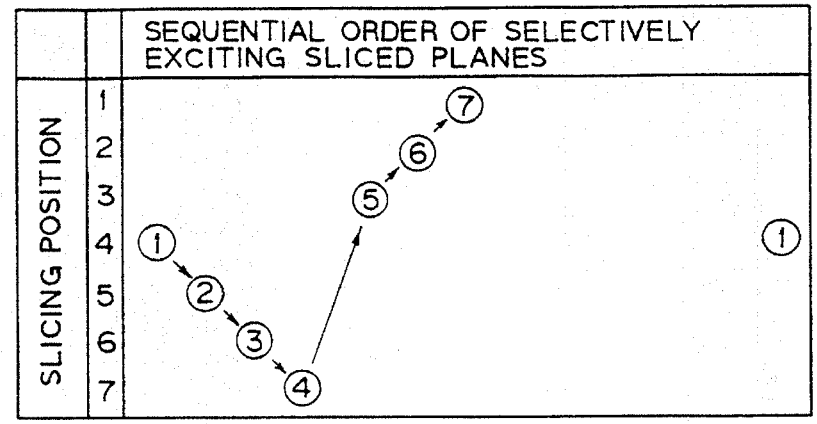
FIG. 9A is a transition diagram of a sequential order of a selective excitation according to a fourth embodiment.
Figure 9B:
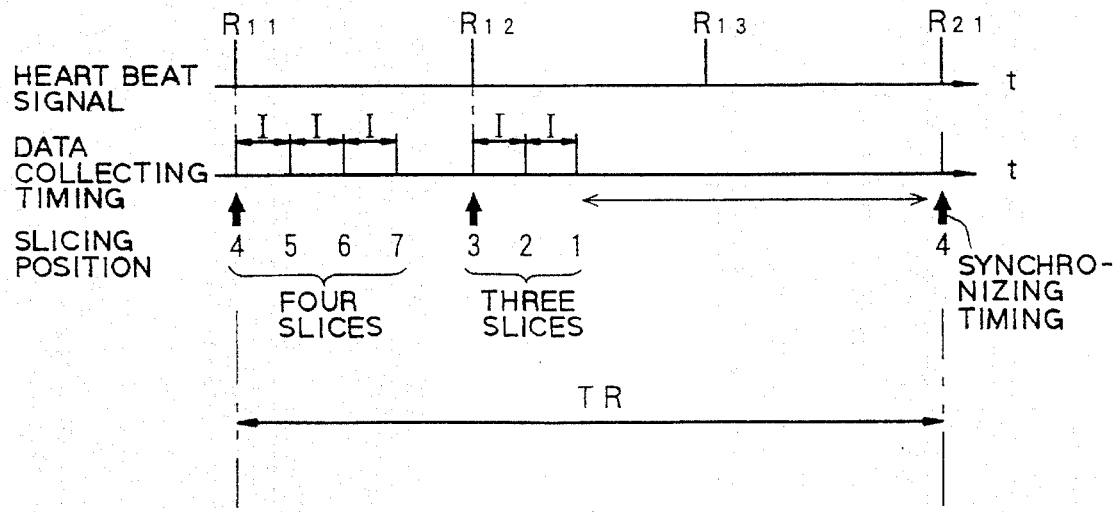
FIG. 9B is a chart illustrating a sequence for collecting image data by means of synchronization with two heart beats according to the fourth embodiment.
Figure 10A:
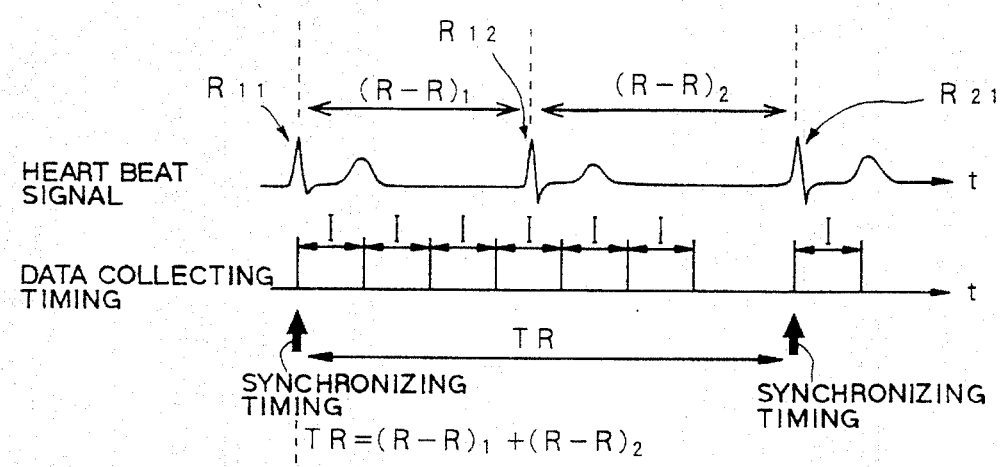
FIG. 10A is a chart illustrating timing of collecting data by means of synchronization with two heart beats according to a conventional example.
Figure 10B:
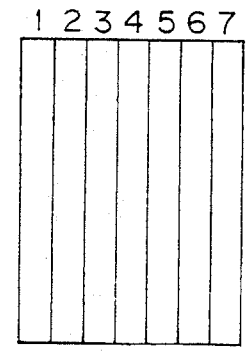
FIG. 10B is a diagram illustrating slicing positions (the number of the sliced planes is seven) of a sliced plane when a sagittal image of the spine is imaged.
Figure 10C:
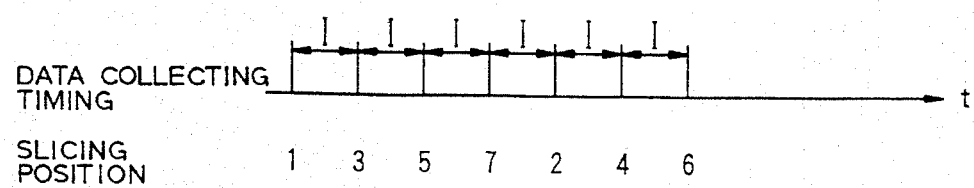
FIG. 10C is a chart illustrating timing of collecting data by means of synchronization with two heart beats according to the conventional example.
Figure 11:
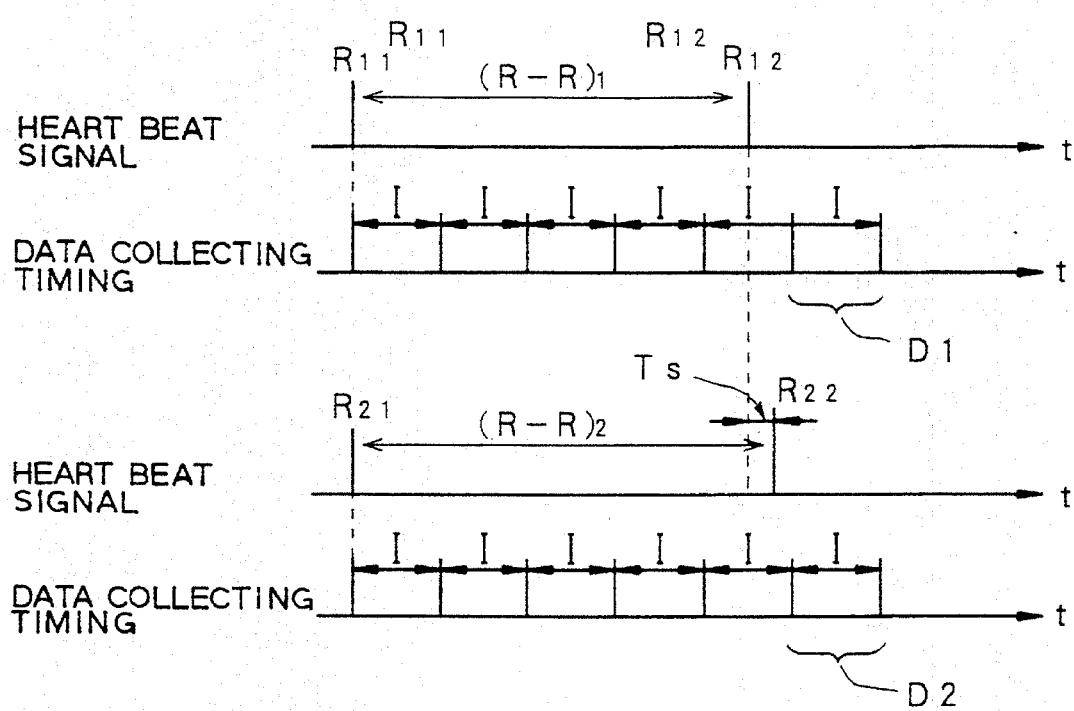
FIG. 11 is a chart illustrating deviation in timing of collecting data according to the conventional example.

A transition diagram of the sequential order of the selective excitation at the time of collecting image data of seven sliced planes (sagittal planes) by means of synchronization with three heart beats and an example of a sequence of collecting image data are shown in FIG. 9. In this case, first synchronization with the first R wave (R11) is performed to excite the sagittal plane 4 to collect image data. Then, the sagittal planes 5, 6 and 7 are sequentially selectively excited to collect image data at every I in a direction in which the slicing position is enlarged. When the sagittal plane 7 has been selectively excited and image data of it has been collected, synchronization with the R wave (R12) at the second heart beat is performed to selectively excite the sagittal plane 3 to collect image data. Then, the sagittal planes 2 and 1 are sequentially selectively excited to collect image data at every I in a direction in which the slicing position is reduced.

When the sagittal plane 1 has been selectively excited and image data of it has been collected, the ensuing time is made to be blank. After TR has passed from selectively exciting the first sagittal plane 4 and collecting image data, the sagittal plane 4 is again selectively excited to collect image data. Then, image data collection is repeatedly performed every TR. In this embodiment, synchronization with the third R wave (R13) is not performed. The reason for this is that the effect of lowering the effect of restricting the artifact in the direction from the sagittal plane 4 toward outside can be maintained. In general, nine sliced planes (rarely eleven sliced planes) is sufficient in the case of the sagittal image of the spine. The minimum value of I is, at most, one hundred and several tens of microseconds in a pulse sequence for an image of a proton density weighted and T2-weighted mode. Therefore, six to seven sliced planes can be imaged in an interval from R to R. Although a blank time is present in this embodiment, a sufficiently practical operation can be realized.

In this embodiment, another arrangement may be employed in which the sequential order of selecting the sliced planes (sagittal planes) is determined to first selectively excite the sliced plane 4, which is the central sliced plane, so that image data is collected, and then sequential selective excitation is performed from the central sliced plane in a direction toward the small slicing position to collect image data. When the collection of image data from all sliced planes in the direction toward the small slicing position has been completed, selective excitation is sequentially performed from the sliced plane adjacent to the central sliced plane, the slicing position of which is larger by one, in a direction toward the large slicing position so that data is collected. With the foregoing arrangement, a similar effect can be obtained.

Recently, there has been developed a magnetic resonance imaging apparatus of a type employing a Fast SE method (different phase encoded field gradients are given to each multiecho (spin echo) generated with a plurality of echoes of 180 degrees to form one image with a plurality of echoes) as the pulse sequence. The Fast SE method realizes an advantage that the scanning time can be shortened to a range from scores of percents to several percent as compared with the conventional scanning time. Furthermore, the Fast SE method is expected to be practically used with a longer repetition time (TR) than that employed in the conventional structure (a sampling period longer than that required for the conventional technology is required to collect image data of one image and thus the number of multislices that can be collected in the same TR decreases excessively as that for the conventional technology).

In a case where the foregoing Fast SE method is used as the pulse sequence and a sagittal image of the spine or the like is imaged by a synchronizing method such as the synchronization with heart beats, the long TR causes a multiheart beat synchronization such as synchronization with four or five heart beats to be employed. However, direct synchronization with the R wave to excite the sliced plane for the purpose of collecting image data similarly to the conventional technology is performed at only the first time. If the sliced planes are continuously excited at a predetermined interval I for the purpose of collecting image data, the time phase of the heart and the timing of collecting image data deviates critically. Thus, there is a possibility that the effect of restricting the artifact deteriorates.

However, employment of the method of collecting image data according to the present invention having the arrangement that synchronization with a plurality of R waves generated in the repetition time is performed to selectively excite the sliced planes to collect image data enables image data collection to be performed by selective excitation of the sliced planes in a short time after the synchronization. As a result, deviation between the time phase of the heart and the timing of collecting image data can be decreased even if the multi-heart-beat synchronization is performed. Consequently, the effect of restricting the artifact can be improved.

As described above, the method of collecting MRI image data and the magnetic resonance imaging apparatus according to the present invention has the arrangement that image data of a plurality of sliced planes is repeatedly collected at every repetition time by synchronizing the timing of collecting image data with the plurality of reference pulses including heart beat signals in such a way that the image data is collected in a sequential order from the sliced plane of clinical importance. Thus, the time which has passed from the synchronizing timing to collecting image data about all sliced planes can be shortened. Therefore, deviation from the time phase of the heart can be decreased, and accordingly the artifact can effectively be restricted.

Further, the time passed from the synchronizing timing can be shortened for the clinically important sliced plane. Therefore, deviation from the time phase of the heart can be decreased, and accordingly the artifact can effectively be restricted.

It is to be understood that the present invention is not limited to the described embodiments and many other changes or modifications may be made without departing the scope of the appended claims.

I claim:

1. A method of collecting image data in magnetic resonance imaging, in which a motion signal of an object to be examined is detected, said motion signal including pulses, and image data of a plurality of continuously arranged physically different two dimensional imaging regions of the object to be examined are collected on the basis of the detected motion signal, the method comprising the steps of:

deciding synchronizing information related to at least two physically different two dimensional imaging regions of the plurality of physically different two dimensional imaging regions, said at least two physically different two dimensional imaging regions being synchronized with at least two different pulses of the motion signal, respectively; and exciting and collecting the image data of the plurality of physically different two dimensional imaging regions on the basis of the synchronizing information.

2. A method of collecting image data according to claim 1, wherein said image data of the plurality of imaging regions are collected at every repetition time by selectively exciting each of the plurality of imaging regions, said repetition time corresponding to two periods of the pulses of the motion signal.

3. A method of collecting image data according to claim 1, wherein said imaging regions are sliced planes in the object.

4. A method of collecting image data according to claim 3, wherein said motion signal is a signal in proportion to movement of a heart in the object.

5. A method of collecting image data according to claim 3, wherein said motion signal is a heart beat signal.

6. A method of collecting image data according to claim 3, wherein said sliced planes synchronized with the pulses of the motion signal are two sliced planes of the object.

7. A method of collecting image data according to claim 3, wherein said image data is collected at every repetition time by selectively exciting each of the plurality of sliced planes.

8. A method of collecting image data according to claim 7, wherein said repetition time corresponds to two periods of the pulses of the motion signal.

9. A method of collecting image data in magnetic resonance imaging, in which a motion signal of an object to be examined is detected, said motion signal including pulses, and image data of a plurality of continuously arranged imaging regions of the object to be examined are collected on the basis of the detected motion signal, the method comprising the steps of:

deciding a sequential order for collecting image data of the plurality of imaging regions;

deciding synchronizing information related to at least two imaging regions of the plurality of imaging regions, said at least two imaging regions being synchronized with at least two different pulses of the motion signal, respectively; and exciting and collecting the image data of the plurality of imaging regions on the basis of the synchronizing information and the sequential order.

10. A method of collecting image data according to claim 9, wherein said synchronizing information decision step includes the steps of dividing the plurality of imaging regions into plural groups of imaging regions and deciding a first order imaging region in each of the plural groups of imaging regions in accordance with the sequential order for collecting image data, said first order imaging region being synchronized with the pulses of the motion signal.

11. A method of collecting image data according to claim 5, wherein said plural groups of imaging regions are two groups of imaging regions.

12. A method of collecting image data according to claim 11, wherein said imaging regions synchronized with the pulses of the motion signal are two imaging regions.

13. A method of collecting image data according to claim 12, wherein said image data of the plurality of imaging regions are collected at every repetition time by selectively exciting each of the plurality of imaging regions, said repetition time corresponding to two periods of the pulses of the motion signal.

14. A method of collecting image data according to claim 13, wherein said sequential order is composed of sequentially selecting imaging regions on every other imaging region.

15. A method of collecting image data according to claim 9, wherein said imaging regions are sliced planes in the object.

16. A method of collecting image data according to claim 15, wherein said synchronizing information deciding step includes the steps of dividing the plurality of sliced planes into plural groups of sliced planes and deciding a first order sliced plane in each of the plural groups of sliced planes in accordance with the sequential order for collecting image data, and first order sliced planes being synchronized with the pulse of the motion signal.

17. A magnetic resonance imaging apparatus, in which a motion signal of an object to be examined is detected, said motion signal including pulses, and image data of a plurality of continuously arranged imaging regions of the object to be examined are collected on the basis of the detected motion signal, the apparatus comprising:

means for deciding a synchronizing information related to at least two imaging regions of the plurality of imaging regions, said at least two imaging regions being synchronized with at least two different pulses of the motion signal, respectively; and means for exciting and collecting the image data of the plurality of imaging regions on the basis of the synchronizing information.

18. A method of collecting image data in magnetic resonance imaging, in which a motion signal of an object to be examined is detected, said motion signal including pulses, and image data of a plurality of continuously arranged imaging regions of the object to be examined are collected on the basis of the detected motion signal, the method comprising the steps of:

deciding a sequential order for collecting image data of the plurality of imaging regions, the sequential order being arranged in order of a clinical importance of said imaging regions;

exciting and collecting the image data of the plurality of imaging regions in synchronization with one of the pulses of the motion signal on the basis of the sequential order; and repeating the excitation and collection of the image data of the plurality of imaging regions at every repetition time.

19. A method of collecting image data according to claim 18, wherein said repetition time corresponds to two periods of the pulses of the motion signal.

20. A method of collecting image data according to claim 18, wherein the order of said clinical importance includes a most clinical important imaging region, said plurality of imaging regions of the object to be examined are a plurality of sagittal planes of a spine, and said most clinical important imaging region is the sagittal plane including the median line of the object to be examined.

21. A method of collecting image data according to claim 20, wherein said sequential order is composed of collecting first image data of the sagittal plane including the median line firstly, said sagittal plane including the median line being the reference plane, collecting second image data of the sagittal planes toward a direction away from the reference plane in parallel with a sliced direction alternately, said sagittal planes being arranged by the one side of a sliced plane adjacent to the reference plane and another side of a sliced plane adjacent to the reference plane.

22. A method of collecting image data according to claim 20, wherein said sequential order is composed of collecting first image data of the sagittal plane including the median line firstly, said sagittal plane including the median line being the reference plane, collecting second image data of the sagittal planes toward a direction away from the reference plane in parallel with a slicing direction secondly, said sagittal planes being arranged by the one side of the sliced plane adjacent to the reference plane, and collecting third image data of the sagittal planes toward a direction away from the reference plane in parallel with a slicing direction thirdly, said sagittal planes being arranged by another side of the sliced plane adjacent to the reference plane.

23. A method of collecting image data according to claim 18, wherein said imaging regions are sliced planes in the object.

24. A method of collecting image data according to claim 23, wherein said repetition time corresponds to two periods of the pulses of the motion signal.

25. A magnetic resonance imaging apparatus, in which a motion signal of an object to be examined is detected, said motion signal including pulses, and image data of a plurality of continuously arranged imaging regions of the object to be examined are collected on the basis of the detected heart beat signal, the apparatus comprising:

means for deciding a sequential order for collecting image data of the plurality of imaging regions, the sequential order being arranged in order of a clinical importance of said imaging regions;

means for exciting and collecting the image data of the plurality of imaging regions in synchronization with one of the pulses of the motion signal on the basis of the sequential order; and means for repeating the excitation and collection of the image data of the plurality of imaging regions at every repetition time.

26. A method of collecting image data in magnetic resonance imaging, in which a motion signal of an object to be examined is detected, said motion signal including pulses of the motion signal, and image data of a plurality of continuously arranged sliced planes of the object are collected on the basis of the detected motion signal, the method comprising the steps of:

deciding a sequential order for collecting image data of the plurality of sliced planes including a most clinically important sliced plane;

deciding a synchronizing information related to at least two sliced planes of the plurality of sliced planes, said at least two sliced planes including the most clinically important sliced plane and being synchronized with at least two different pulses of the motion signal; and exciting and collecting the image data of the plurality of sliced planes on the basis of the synchronizing information and the sequential order.

27. A method of collecting image data in magnetic resonance imaging, in which a motion signal of an object to be examined is detected, said motion signal including pulses, and image data of a plurality of continuously arranged different physical two dimensional imaging regions of the object to be examined are collected on the basis of the detected motion signal, the method comprising the steps of:

exciting said plurality of physically different two dimensional imaging regions in a sequence wherein each of at least two physically different two dimensional imaging regions of said plurality of physically different two dimensional imaging regions is synchronized with a pulse of the motion signal, in said sequence respectively; and collecting the image data from said plurality of different physical two dimensional regions in response to said excitation.

28. The method of claim 27 further comprising the step of repeating said sequence.

29. The method of claim 27 wherein the number of pulse of the motion signal in each sequence is at least two.

30. The method of claim 27 further comprising the step of:

specifying a synchronizing information related to at least two physically different two dimensional imaging regions of said plurality of continuously arranged physically different two dimensional imaging regions, prior to said exciting step; and wherein said exciting step is performed in accordance with said synchronizing information.

* * * * *